United States Patent [19]

Sinha et al.

[11] Patent Number: 5,292,554
[45] Date of Patent: Mar. 8, 1994

[54] DEPOSITION APPARATUS USING A PERFORATED PUMPING PLATE

[75] Inventors: Ashok K. Sinha, Palo Alto; Steve G. Ghanayem, Sunnyvale; Virendra V. S. Rana, Los Gatos, all of Calif.

[73] Assignee: Applied Materials, Inc., Santa Clara, Calif.

[21] Appl. No.: 975,251

[22] Filed: Nov. 12, 1992

[51] Int. Cl.$^5$ .......................................... C23C 16/00
[52] U.S. Cl. .................... 427/251; 427/248.1; 427/250; 427/255.5; 118/720; 118/725; 118/728; 118/500; 118/503
[58] Field of Search ............... 118/725, 728, 500, 503, 118/720; 427/248.1, 250, 251, 255.5

[56] References Cited

U.S. PATENT DOCUMENTS

| | | | |
|---|---|---|---|
| 4,842,683 | 6/1989 | Cheng et al. | 156/345 |
| 4,931,135 | 6/1990 | Horiuchi et al. | 156/643 |
| 4,932,358 | 6/1990 | Studley et al. | 118/728 |
| 4,951,601 | 8/1990 | Maydan et al. | 118/719 |
| 4,962,727 | 10/1990 | Harada | 118/723 |
| 4,963,393 | 10/1990 | Goela et al. | 427/248.1 |
| 4,963,713 | 10/1990 | Horiuchi et al. | 219/121.43 |
| 4,978,412 | 12/1990 | Aoki et al. | 156/345 |
| 4,990,374 | 2/1991 | Keeley et al. | 477/255.1 |
| 5,013,400 | 5/1991 | Kurasaki et al. | 156/643 |

FOREIGN PATENT DOCUMENTS 196019A 10/1986 United Kingdom.

OTHER PUBLICATIONS

Rana, Virendia, D. S. et al., Editors, *Advanced Metallization for BLSI Applications*, Materials Research Society, pp. 453–462, Pittsburgh, Pa. 1992. (Paper presented Oct. 8, 9, or 10, 1991, entitled "An Integrated Tungsten Plug Fabrication Process", by Mak et al.).

*Primary Examiner*—Richard Bueker
*Attorney, Agent, or Firm*—Ashok K. Janah; Jeffrey G. Sheldon

[57] ABSTRACT

In a deposition apparatus, a barrier is used to separate a process gas section from the section of the chamber below the substrate on which a metal layer is deposited. The substrate is supported on a support. During an unloading stage, purge gas is introduced into the chamber below the substrate. To prevent the substrate from being moved on the support by the purge gas, the barrier is perforated so that the process gas can flow through the barrier and into a vacuum manifold system.

24 Claims, 3 Drawing Sheets

DEPOSITION APPARATUS USING A PERFORATED PUMPING PLATE

BACKGROUND

This invention relates to an improved deposition apparatus and process for depositing a material on a substrate.

A layer of a material, such as a tungsten layer, can be deposited on a substrate, such as a semiconductor wafer or a flat panel display, using a chemical vapor deposition (CVD) process or physical deposition process. Exemplary of such processes is the deposition of tungsten on a semiconductor wafer using a CVD process. In this process, the substrate is loaded into a deposition chamber from a load lock chamber, and conventionally mounted horizontally in the deposition chamber with an upper deposition surface of the substrate facing toward incoming process gases. The deposition gases are usually emitted to the deposition chamber containing the wafer from a gas inlet or "shower head" located near the top of the CVD chamber. The chamber has a process gas section in contact with the deposition surface of the wafer, and a gas purge section. The process gas section and the gas purge section are separated by a horizontally extending barrier, which is conventionally known as a pumping plate.

After deposition of metal on the wafer, the wafer is removed from the deposition chamber through a slit valve into the load lock chamber. At that time, purge gases are introduced into the gas purge section of the chamber from the load lock chamber when the slit valve is open. The purge gas removes residual process gases and contaminants such as reaction byproducts from the chamber. It is important to do this so that the deposition chamber and other chambers of the metal deposition system, such as a wafer loading chamber and a wafer removal chamber, remain clean. Residual process gases can result in formation of particulate contaminants. Contamination of these chambers by particles can result in particle deposition on the product, which in most cases renders the product unusable. The purge gas from the load lock chamber, typically nitrogen, flows through the gas purge section, through an opening between a shadow ring and the wafer, into the process gas input section, and from there into a vacuum manifold system.

A problem that has been encountered is that the purge gas moves the wafer. This can lead to unloading errors resulting in damage to the wafer, and interruption of the automatic production process. These unloading errors occur because the wafer is not found at its designated position by the pickup mechanism due to the movement caused by the purge gas. Lost production due to damaged wafers and the downtime resulting from this problem lowers production rates, thereby increasing production costs.

Accordingly, there is a need for an apparatus and a method for depositing a material on a substrate, where spent process gas and byproducts of the process gas can be purged from the deposition chamber, without unloading errors caused by movement of the substrate during the purge.

SUMMARY

The present invention satisfies this need by providing perforations in the barrier or pumping plate, where the perforations are sized so that the cross-sectional area is sufficiently large to allow the load lock purge gas to exit from the gas purge section without moving the substrate relative to the support. Further, the perforations are sized so their cross-sectional area is sufficiently small and the perforations are located a sufficient distance away from the substrate that substantially no deposition of the material on the backside of the substrate occurs during deposition.

In particular, the present invention provides a method for depositing material on a substrate, where the substrate comprises a deposition surface and a second back surface on which substantially less material deposition is to occur. The process is useful for depositing a metal such as tungsten on a silicon wafer, and oxides of silicon on a glass substrate for manufacturing a flat panel display. The method comprises the steps of loading the substrate onto a support contained in the deposition chamber, where the chamber has a process gas section in contact with the deposition surface of the substrate. After the substrate is loaded, the material is deposited on the substrate by introducing a process gas into the process gas section. The chamber has a perforated barrier plate separating the process gas section from the second surface of the substrate for inhibiting process gas from contacting the second surface. The perforations are sufficiently small and placed a sufficient distance away from the substrate that substantially no deposition of the metal on the backside of the substrate occurs. Preferably deposition on the backside of the substrate is further prevented by maintaining a flow of an anti-deposition gas, such as argon, into a gas purge section of the chamber, which is below the barrier plate.

After deposition, the purge gas is introduced into a flow path that is proximate to the second surface (i.e., backside) of the substrate. The cross-sectional area of the perforations in the perforated barrier plate are sufficiently large to allow the purge gas to flow through the barrier plate into the process gas section without moving the substrate relative to the support.

A preferred apparatus for practicing this method comprises (i) a chamber that has within it the support for the substrate, (ii) the process gas section which is in fluid contact with the deposition surface of the substrate when the substrate is on the support, (iii) the gas purge section which is in fluid contact with the backside of the substrate when the substrate is on the support, (iv) a first inlet for introducing the process gas into the process gas section, (v) an outlet for removing spent process gas and process gas byproducts from the process gas section, (vi) the perforated barrier separating the process gas section from the gas purge section, and (vii) a second inlet for inputting the load lock purge gas into the gas purge section.

Because of the perforated barrier, product defects and machine downtime resulting from purge gas moving the substrate are avoided. By use of present invention, better quality products can be realized, and higher on-stream times can be achieved, with less manpower requirements and fewer reject parts being produced.

BRIEF DESCRIPTION OF THE DRAWINGS

These and other features, aspects, and advantages of the present invention will become better understood with reference to the following description, appended claims, and accompanying drawings where:

DESCRIPTION

Figure 1:
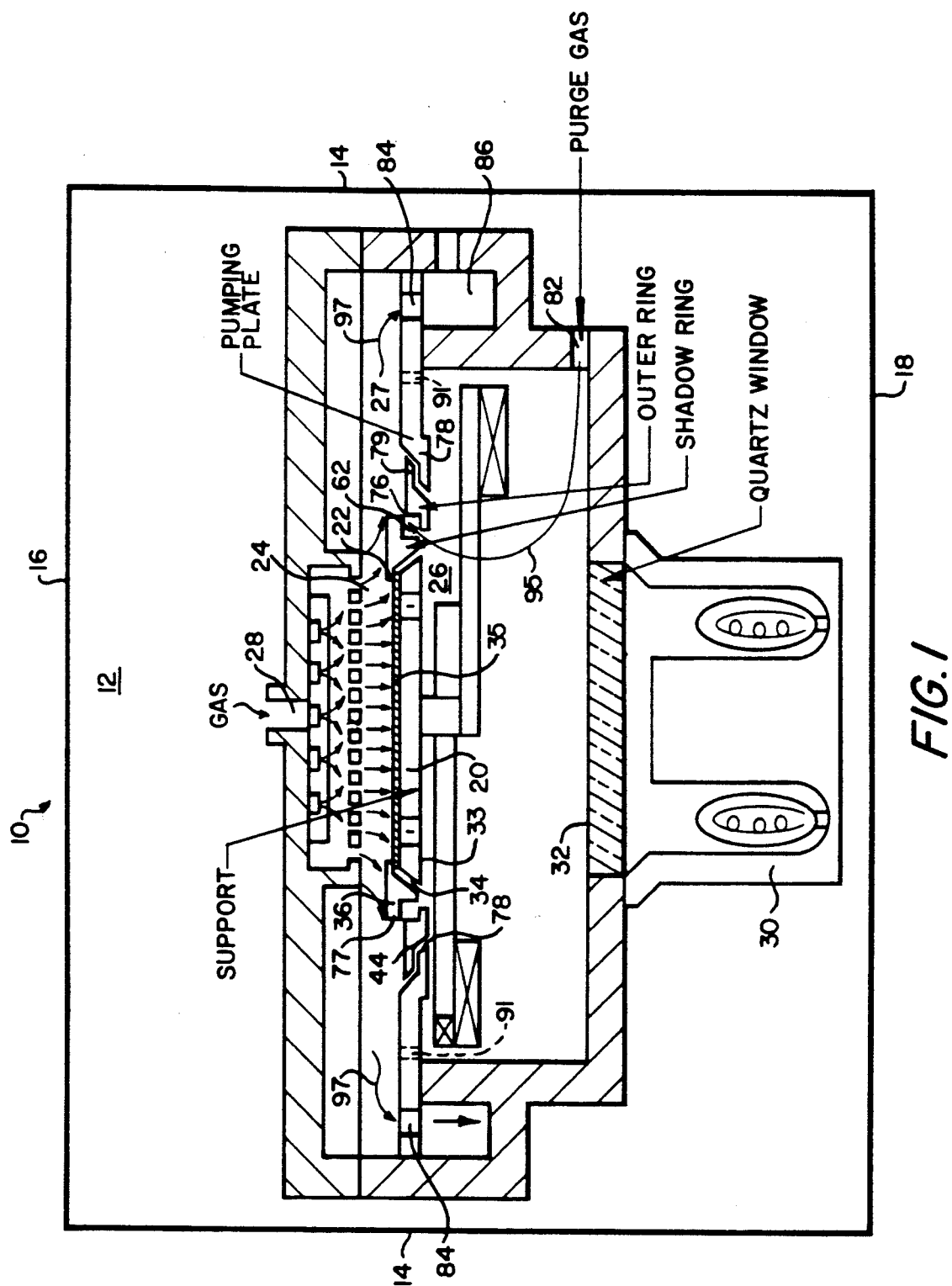
FIG. 1 is a schematic view, in vertical cross-section, of an apparatus according to the present invention suitable for depositing a metal layer on a substrate, the apparatus having a perforated barrier plate and operating in a deposition mode.
Figure 2:
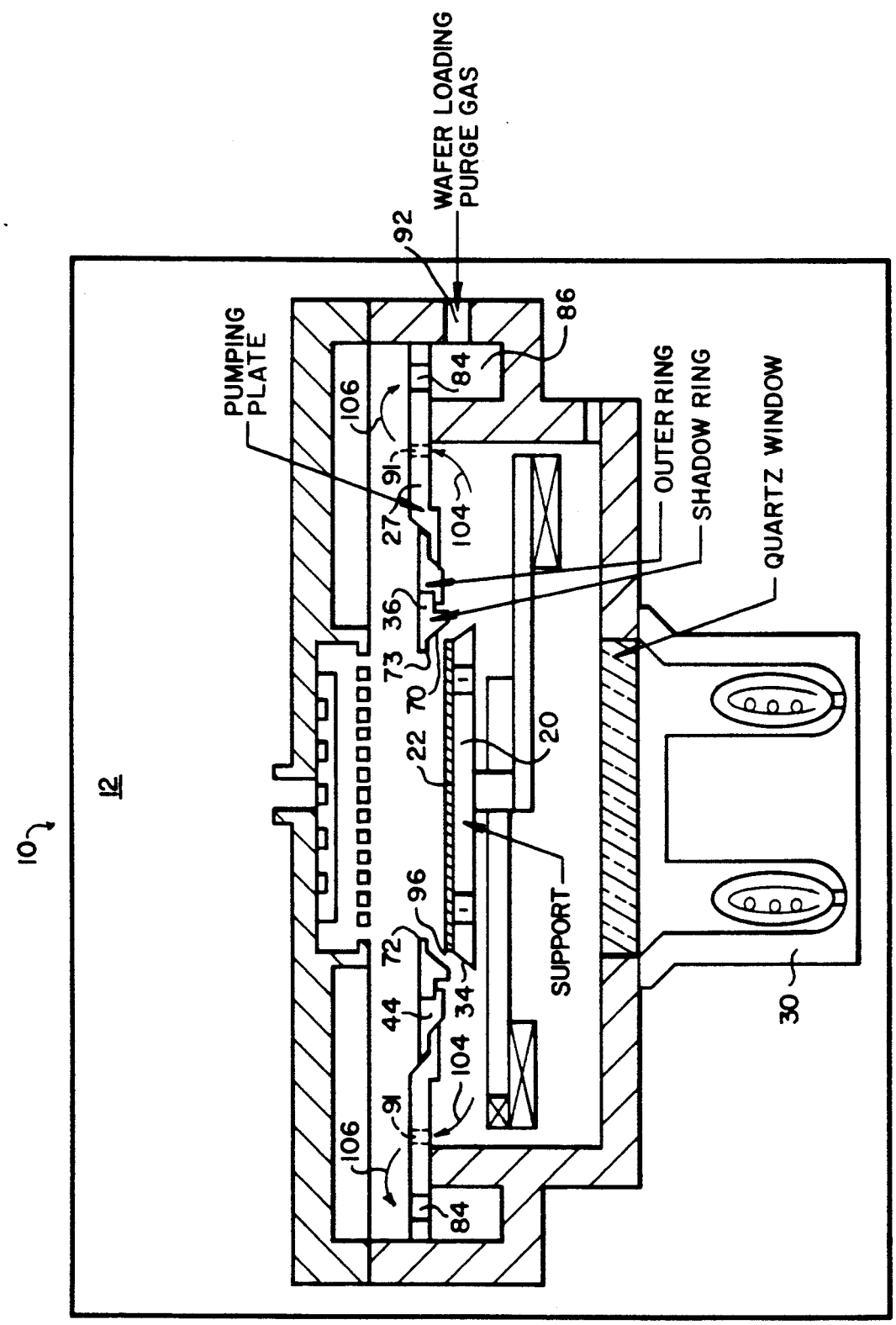
FIG. 2 is a schematic view, in vertical cross-section, of the apparatus of FIG. 1 operating in a purge mode.

An apparatus 10 according to the present invention is generally shown in FIGS. 1 and 2. The apparatus 10 comprises a chamber 12 having side walls 14, a top wall 16, and a bottom wall 18. Within the chamber 12 is located a vertically moveable support or susceptor 20, on which rests a thin, circular substantially flat substrate 22 such as a silicon based semiconductor wafer. The substrate 22 is in a generally horizontal configuration. The support 20 is used to raise and lower the substrate 22. The interior volume of the chamber is divided into two sections, a process gas section 24 above the substrate and a purge gas section 26 below the substrate 22, with both sections being in fluid communication with the substrate. A horizontally oriented barrier, a pumping plate 27, separates the process gas section 24 from the gas purge section 26.

The support 20 is beneath a process gas inlet 28 used for introducing a reactive gas into the reactive gas section 24. A heater module 30 is below the support 20 and separated from the gas purge section by a quartz window 32. The heater module 30 provides the energy required to heat the support 20 and thereby the substrate 22 for the deposition reaction that occurs in the chamber 12.

The support 20 can be raised and lowered between a deposition position (shown in FIG. 1) and a loading/unloading purge position (shown in FIG. 2).

The support 20, on which the substrate 22 is supported, comprises a disc-like circular metal member having a broad base or bottom surface 33 with a tapered side wall 34 leading to a narrower top surface 35. The top surface 35 of the support is about equal in diameter to the diameter of the circular substrate 22 at the deposition temperature, e.g., at a temperature ranging from about 200° to about 700° C. The substrate 22 is actually supported by an annular shield or shadow ring 36 during deposition.

When the support 20 is in its raised position, the shadow ring 36 engages the front side edge of the substrate 22. The shadow ring 36, by engaging the front side edge of the substrate 22, shields the edge of the deposition surface of the substrate 22 as well as the backside of the substrate 22 from deposition of metal. A problem that previously arose during the deposition was undesired deposition of the metal on the backside of the wafer 22. This undesired deposition resulted from migration of the deposition gases 22, from above the wafer, around the end edge of the wafer to the backside of the wafer. To solve this problem of undesired depositions on the backside of the wafer, the shadow ring 36 is used, the shadow ring 36 surrounding the wafer 22 and having a central opening slightly smaller than the outer diameter of the wafer 22. The shadow ring engages the peripheral edge of the front surface of the wafer 22, leaving the front surface available for deposition while effectively blocking migration of the deposition gases around the end edge of the wafer to deposit on the backside of the wafer. As discussed below, an opening is provided adjacent to the end edge of the shadow ring through which an anti-deposition gas, such as argon, is upwardly flowed from beneath the shadow ring. This flow of anti-deposition gas acts as a further inhibiter or shield to prevent the deposition gases from reaching the backside of the wafer.

The use of a shadow ring or shield is described in detail in U.S. patent application Ser. No. 07/823,942, filed Jan. 22, 1992, as a continuation application of Ser. No. 07/622,664, filed Dec. 5, 1990, now abandoned; and is also described in co-pending U.S. patent application Ser. No. 972,674, filed on Nov. 6, 1992 entitled, "Improved Metal Chemical Vapor Deposition Process Using a Shadow Ring", by Steve G. Ghanayem and Virendra V. S. Rana. These three patent applications are incorporated herein by this reference.

A support ring or outer ring 44 is located between the shadow ring 36 and the pumping plate 27. The support ring 44 rests on the pumping plate 27 and supports the shadow ring 36 when the support 20 is in the unloading position, as shown in FIG. 2.

Preferably the central opening of the shadow ring 36 is provided with a tapered inner edge 70 on its lower surface, the taper having approximately the same angle of taper as the tapered side wall 34 of the support 20, i.e., a matching taper. The tapered inner edge 70 terminates, at its upper end, at an inner lip 72. The inner lip 72 is dimensioned to inwardly extend circumferentially from the tapered inner edge 70 a predetermined distance to extend over the front of the substrate 22. The inner lip 72 has an undersurface 73 which is flat and parallel to the surface of the substrate 22 to permit flat contact therebetween which provides at least a partial seal to inhibit passage of the deposition gas therebetween. The inner lip 72 is usually dimensioned to extend inwardly over the front side edge of the substrate a distance from about 1.5 to about 6 millimeters (mm), typically about 5 mm, to provide the desired sealing and front side edge shielding.

The inside diameter of the top portion of the tapered inner edge 70 of the shadow ring 36 is just slightly larger than the outer diameter of the top surface 35 of the support 20, i.e. by about 1 mm, while the outer diameter of the shadow ring 36 at the bottom of the tapered inner edge 70 is larger than the outer diameter of the bottom surface of the support by about the same amount. This tolerance helps compensate for possible differences in thermal expansion when different materials are used in constructing the support 20 and the shadow ring 36. Tolerance is also provided to insure that as the support 20 and the substrate 22 are lifted into contact with the shadow ring 36, the shadow ring 36 is not supported by contact between the tapered inner edge 70 of the shadow ring 36 and the tapered outer edge 34 of the support 20, but rather by contact of the underside of the inner lip 72 with the top surface 35 of the substrate 22 to enhance the sealing therebetween.

When the support 20 and substrate 22 are raised to the deposition position, as shown in FIG. 1, the front side edge (the edge of the top surface) of the substrate 22 engages the under surface of the inner lip 72 of the shadow ring 36 and lifts the shadow ring 36 off the outer ring support 44 on which the shadow ring 36 normally rests when not engaged by the substrate 22. When the shadow ring 36 has been raised off the support ring 44 by the support 20, a passageway 62 exists between the inner periphery of the support ring 44 and the outer periphery of the shadow ring 36.

The shadow ring 36 and the support ring 44 cooperate in a manner similar to the cooperation of the shadow ring 36 and the support 26, as just described. In particular, preferably the central opening of the support ring 44 is provided with an inner edge 76 terminating at its lower end at an inner lip 78. The inner lip 78 is dimensioned to inwardly extend circumferentially from the inner edge 76 a predetermined distance to extend under a corresponding lip 79 on an upper portion of an outer wall 77 of the shadow ring 36. The support ring inner lip 78 has an upper surface which is flat and parallel to the shadow ring lip 79 to permit flat contact therebetween.

Figure 3:
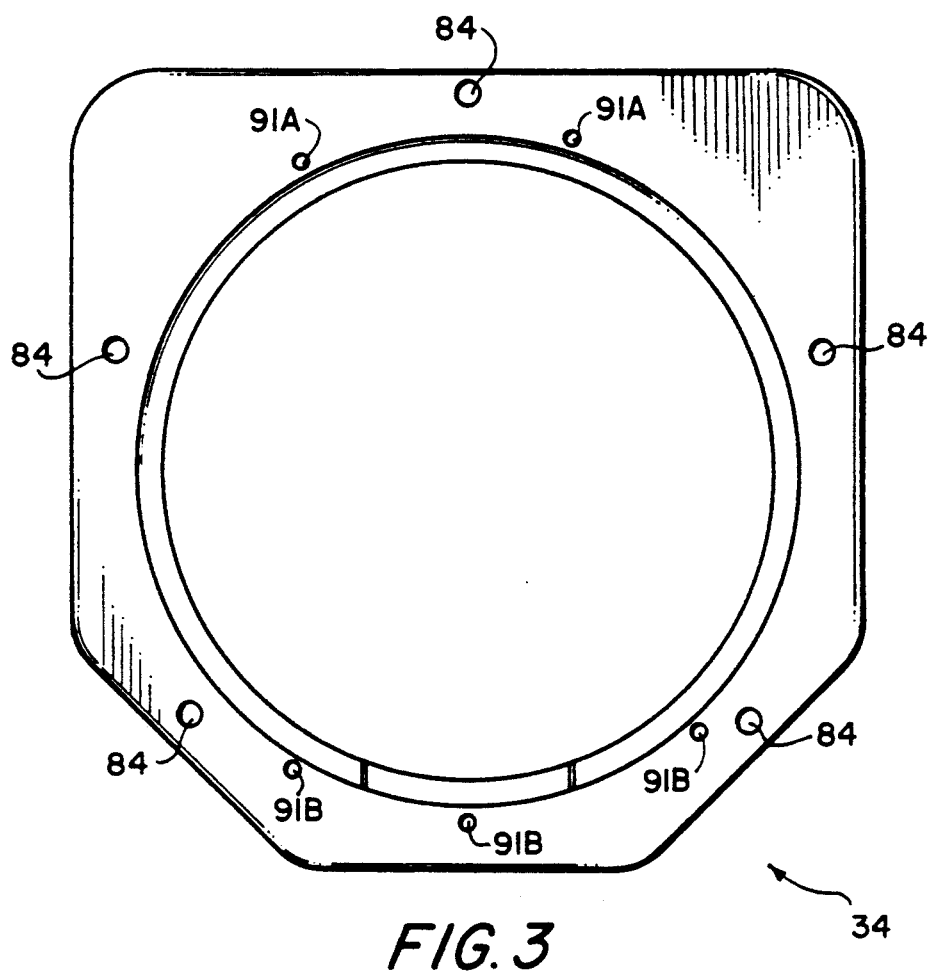
FIG. 3 is a top plan view of the separation plate used in the apparatus of FIGS. 1 and 2.

Gases are introduced into and withdrawn from the chamber 12. The gas inlet 28 is provided for introducing a reactive process gas. The chamber 12 is provided with an anti-deposition gas inlet 82 for providing an anti-deposition gas into the purge gas section 26. The pumping plate 27 has exhaust holes 84 therethrough in fluid communication with a vacuum manifold 86 for withdrawing spent process gas and process gas byproducts, as well as anti-deposition gas, from the chamber 12. As best shown in FIG. 3, the pumping plate 27 has a plurality of circular perforations 91 therethrough, whose purpose will be described in detail below.

A wafer load inlet 92 is provided through the side wall 14 of the chamber 12. A purge gas is introduced through the wafer load inlet 92 when the wafer load inlet is in use. It is this purge gas which causes the problem solved by the present invention, namely, undesired movement of the substrate 22 on the support 20.

A process using the apparatus 10 includes the steps of depositing a material such as a metal on the substrate 22, and once all metal layers are deposited on the substrate 22, unloading the substrate with the metal layer(s) thereon and loading in a new substrate.

With reference to FIG. 1, in the deposition stage of the process, the support 20 is raised with the substrate 22 in contact with the shadow ring 36, with the gap or passageway 62 between the shadow ring 36 and the support ring 44. Process gas is introduced through the process gas inlet 28 into the process gas section 24, where the gas undergoes reactions to deposit metal on the deposition surface of the substrate 22. The shadow ring 36 inhibits the deposition gas from migrating to the outer edge and back surface of the substrate 22, thereby inhibiting the deposition of metal on the surfaces. Such deposition is also inhibited by introducing anti-deposition gas such as argon through the anti-deposition gas inlet 82 into the purge gas section 26. The anti-deposition gas does not interfere with deposition on the deposition surface of the substrate 22. Most of the anti-deposition gas passes through the passageway 62, as shown by arrow 95, thereby preventing reactive gas from passing through the passageway 62 and depositing on the back surface of the substrate 22. Some of the anti-deposition gas also passes through the perforations 91 in the pumping plate 27, thereby preventing reactive gases from passing through the perforations 91 to the backside of the substrate 22. During the deposition stage, anti-deposition gas, spent process gas and byproducts of the process gas are withdrawn from the gas input section through the exhaust holes 84 in the pumping plate 27 and into the vacuum manifold 86, as shown by arrows 97.

The rate of gas flow depends upon the size of the substrate, the material to be deposited, and the rate at which the material is to be deposited. Typically, the process gas is introduced at a rate of from about 100 to about 6,000 standard cubic centimeters (sccm), more typically at a rate of from about 500 to about 1,000 sccm, and the anti-deposition gas is introduced during the deposition stage at a rate from about 300 to about 5,000 sccm, more typically at a rate of from about 1,000 to about 3,000 sccm. For example, in an exemplary process for depositing tungsten on a 6-inch diameter silicon wafer 22, process gas comprising hydrogen and $WF_6$ sccm and about 75 sccm respectively, while maintaining a pressure in the chamber from about 70 Torr to about 100 Torr, typically about 80 Torr, while the support 20 is maintained at deposition temperature of from about 450° to typically about 475° C. In this exemplary process, the anti-deposition gas can be introduced at a rate of from about 1,000 sccm to about 3,000 sccm.

During the loading/unloading stage, as shown in FIG. 2, the support 20 is lowered so that the substrate 22 is no longer in contact with the shadow ring 36, wherein the shadow ring 36 sits against the outer ring support 44. A passageway 96 is provided between the substrate 22 and the shadow ring 36. Purge gas is introduced through the inlet 92 to force process gas byproducts and other particle-forming contaminants out of the remaining portion of the apparatus 10. The purge gas can be introduced at a rate from about 100 sccm to about 1000 sccm, and typically at a rate of from about 450 to about 800 sccm. The purge gas passes from the purge gas section 26, through the passageway 96 and the perforations 91, into the process gas section 24 as shown by arrows 104. Then, the purge gas and any residual process gas contained in the process gas section 24 are withdrawn therefrom by a vacuum system, the gas passing through the exhaust holes 84 in the pumping plate 27, as shown by arrows 106, and into the vacuum manifold 86.

If the perforations 91 are too large, then during the deposition stage, the pressure differential across the perforations caused by the anti-deposition gas flow, will be insufficient. This will result in the anti-deposition gas not preventing the process gas from passing through the perforations 91 and contacting the backside of the substrate 22. If the process gas contacts the backside of the substrate 22, undesirable depositions of metal on the backside occurs. This can result in undesirable peeling of one of the metallic layers on the substrate.

Conversely, if the perforations 91 are too small, during the load/unload stage, too much purge gas will be forced through gap 96 between the substrate 92 and the shadow ring 36, which can cause movement or chattering of the substrate 22.

As shown in FIG. 3, a plurality of small perforations 91 can be used, with the perforations 91 located near the periphery of the pumping plate 27. The perforations 91 are equidistantly located from the center of the pumping plate 27, and are slightly radially inwardly from the vacuum holes 84. Preferably the perforations 91 are not symmetrically located around the periphery, but generally fewer are located near the vacuum manifold than away from the vacuum manifold, to provide relatively equal distribution of the purge gas. In FIG. 3, there are two perforations 91A toward the vacuum manifold, and three perforations 91B away from the vacuum manifold.

The exact number and size of the perforations 91 are chosen with consideration of the flow rate of the purge gas and the size of the passageway 96 between the substrate 22 and the shadow ring 36. The larger the passageway 96, the smaller need be the cross-sectional area of the perforations. Generally, the cross-sectional area of the flow path of the passageway 96 and the perforations 91, combined, can be from about 0.1 to about 3 square inches, and typically from about 0.5 to about 1.5 square inches, preferably from about 0.7 to about 1.1 square inches, and most preferably from about 0.9 to about 1.1 square inches per 100 sccm of purge gas. For example, for a gas purge rate of 450 sccm, the cross-sectional area of the flow path of the passageway 96 is about 5 square inches and the pumping plate 27 has five perforations 91 of 0.25 inches in diameter, providing about 0.245 square passage, for a total flow path of about 0.745 square inches.

It has been determined that adding the perforations 91 to the pumping plate 27 solves the problem of movement of the substrate 22 by purge gas during the unloading stage. The perforations 91 in the pumping plate had no adverse effects on the deposition process. The perforations 91 caused no deposition on the backside of the substrate 22, had no effect on the uniformity of the deposition, and resulted in no increase in the number of particles produced in the system.

While the present invention has been described in considerable detail with reference to certain preferred versions thereof, other versions are possible. For example, the present invention is not limited to use with silicon wafers and tungsten deposition. The present invention can be used with any substrate on which it is desired to deposit a metal, including semiconductor surfaces such as silicon, synthetic polymeric materials, and glass. Moreover, the present invention can be used with the vapor deposition of many metal containing compounds, including silver, gold, copper, titanium, titanium nitride, and oxides of silicon. The process gas can comprise one or more gases which under the process conditions in the chamber 12 deposit the desired metal containing compound, and can include such gases as $WF_6$, $SiH_4$, and non-reactive carrier gases such as argon, nitrogen, and helium. The purge gas, both that used during the deposition stage and introduced through the inlet 82, as well as the purge used during the unloading/loading stage and introduced through the inlet 92, can be any non-reactive gas such as argon, helium, and nitrogen. Further, the present invention is useful in a process where controlled deposition of a material the backside of the substrate 22 is permitted. In addition, the present invention can be used in a variety of deposition processes, including chemical vapor deposition and direct deposition processes.

Therefore the spirit and scope of the appended claims should not be limited to the description of the preferred versions contained herein.

What is claimed is:

1. An apparatus for depositing a material on a substrate, the substrate comprising a deposition surface and a second surface on which substantially less material deposition is to occur, the apparatus comprising:
   (a) a support for the substrate;
   (b) a process gas section in contact with the deposition surface of the substrate when the substrate is on the support;
   (c) a first inlet for introducing a process gas comprising at least a component of the material into the process gas section during a deposition stage;
   (d) a barrier means separating the process gas section from the second surface of the substrate for inhibiting process gas from contacting the second surface;
   (e) a second inlet for introducing a purge gas into a flow path comprising a section proximate to the second surface of the substrate when the substrate is positioned on the support during a purge stage; and
   (f) a plurality of perforations in the barrier, the cross sectional area of the perforations being sufficiently large to allow the purge gas to flow through the barrier into the process gas section without moving the substrate relative to the support.

2. The apparatus of claim 1 wherein the cross sectional area of the perforations is sufficiently small that substantially no deposition of the material on the second surface of the substrate occurs during the deposition stage.

3. The apparatus of claim 1 comprising a shield for contacting the edge of the substrate and inhibiting reactive gas from contacting the backside of the substrate during the deposition stage.

4. The apparatus of claim 3 wherein the support is moveable to provide a gap between the shield and the substrate for purge gas to flow therethrough during the purge stage.

5. The apparatus of claim 1 wherein the substrate is a silicon wafer and the material comprises tungsten.

6. The apparatus of claim 1 wherein the substrate is a glass plate and the material comprises an oxide of silicon.

7. The apparatus of claim 1 wherein the perforations are not symmetrically located in the barrier.

8. An apparatus for depositing a layer of a material on a substrate, the substrate comprising a deposition surface, an opposed backside on which substantially no material deposition is to occur, and an edge therebetween, the apparatus comprising:
   (a) a moveable support for the substrate,
   (b) a process gas section in contact with the deposition surface of the substrate when the substrate is on the support,
   (c) a gas purge section in fluid contact with the backside of the substrate when the substrate is on the support,
   (d) a process gas inlet for process gas into the process gas section during a material deposition stage,
   (e) an outlet for removing spent process gas and process gas byproducts from the process gas input section,
   (f) a separation plate separating the process gas section from the gas purge section, and
   (g) a purge gas inlet for inputting a purge gas into the gas purge section during a purge stage,
   wherein the separation plate comprises a plurality of perforations providing sufficient cross sectional area to allow the purge gas to flow from the gas purge section and through the separation plate into the process gas section without moving the substrate relative to the support, the cross sectional area of the perforations being sufficiently small that substantially no deposition of material on the backside of the substrate occurs during the deposition stage.

9. The apparatus of claim 8 wherein the material is a metal and the substrate is a silicon wafer.

10. The apparatus of claim 9 wherein the metal comprises tungsten.

11. The apparatus of claim 8 wherein the substrate is glass for a flat panel display and the material comprises an oxide of silicon.

12. A method for depositing material on a substrate, the substrate comprising a deposition surface and a second surface on which substantially less material deposition is to occur, the method comprising the steps of:

(a) loading the substrate onto a support contained in a deposition chamber, the chamber having a process gas section in contact with the deposition surface of the substrate (b) after the loading step, depositing the material on the substrate by introducing a process gas into the process gas section, the deposition chamber having a perforated plate separating the process gas section from the second surface of the substrate for inhibiting process gas from contacting the second surface, the perforations being sufficiently small that substantially no deposition of material on the backside of the substrate occurs; and (c) after the deposition step, introducing a purge gas into a flow path that comprises a section proximate to the second surface of the substrate, the cross sectional area of the perforations being sufficiently large to allow the purge gas to flow through the separation plate into the process gas section without moving the substrate relative to the support.

13. The method of claim 12 wherein the substrate is a silicon wafer and the material comprises a metal.

14. The method of claim 13 wherein the metal is tungsten.

15. The method of claim 12 wherein the substrate is glass and the material comprises silicon oxide.

16. The method of claim 12 wherein before the step of depositing the material on the substrate, the step of contacting the edge of the substrate with a shield for inhibiting process gas from contacting the backside of the substrate during the step of depositing the material on the substrate.

17. The method of claim 16 wherein before introducing the purge gas, separating the shield from the substrate to provide a gap for passage of purge gas into the process gas input section.

18. The method of claim 17 wherein the combined cross-sectional area of the flow path of the gap and the perforations is from about 0.1 to about 3 per 100 sccm of purge gas flow.

19. The method of claim 18 wherein the combined cross-sectional area of the flow path of the gap and the perforations is from about 0.5 to about 1.5 per 100 sccm of purge gas flow.

20. The method of claim 15 wherein the process gas is introduced at a rate from about 100 to about 6,000 sccm, the purge gas is introduced at a rate of from about 450 to about 800 sccm, and the total surface area of the perforations is from about 0.1 to about 1 square inch.

21. The method of claim 19 wherein the purge gas is introduced at a rate from about 450 to about 800 sccm.

22. The method of claim 20 wherein the process gas is introduced into the process gas section at a rate from about 500 to about 1,000 sccm.

23. The method of claim 20 wherein the cross sectional area of the perforations is from about 0.2 to about 0.4 square inch.

24. The method of claim 12 wherein the process gas is introduced at a rate of from about 500 to about 1,000 sccm, the purge gas is introduced at a rate of from about 450 to about 800 sccm, and the total surface area of the perforations is from about 0.2 to about 0.4 square inch.

* * * * *